(12) United States Patent
Shin et al.

(10) Patent No.: US 9,998,094 B2
(45) Date of Patent: Jun. 12, 2018

(54) BULK ACOUSTIC WAVE RESONATOR HAVING A FRAME SPACED APART FROM AN ELECTRODE

(71) Applicant: Samsung Electro-Mechanics Co., Ltd., Suwon-si (KR)

(72) Inventors: Jea Shik Shin, Suwon-si (KR); Yeong Gyu Lee, Suwon-si (KR); Ho Soo Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 14 days.

(21) Appl. No.: 14/918,242

(22) Filed: Oct. 20, 2015

(65) Prior Publication Data

US 2016/0164488 A1 Jun. 9, 2016

(30) Foreign Application Priority Data

Dec. 5, 2014 (KR) ........................ 10-2014-0173807

(51) Int. Cl.
*H03H 9/17* (2006.01)
*H03H 9/02* (2006.01)
*H03H 9/13* (2006.01)

(52) U.S. Cl.
CPC ........ *H03H 9/171* (2013.01); *H03H 9/02118* (2013.01); *H03H 9/02125* (2013.01); *H03H 9/132* (2013.01); *H03H 9/17* (2013.01); *H03H 9/173* (2013.01)

(58) Field of Classification Search
CPC ........... H03H 9/02118; H03H 9/02125; H03H 9/132; H03H 9/17; H03H 9/171; H03H 9/173; H03H 9/174; H03H 9/175

USPC .................................. 333/187, 189; 310/312
See application file for complete search history.

(56) References Cited

U.S. PATENT DOCUMENTS

| | | | |
|---|---|---|---|
| 6,812,619 B1 | 11/2004 | Kaitila et al. | |
| 7,893,793 B2* | 2/2011 | Iwasaki ................. | H03H 9/173 310/312 |
| 8,456,257 B1* | 6/2013 | Fattinger ............ | H03H 9/02086 310/312 |
| 9,385,684 B2* | 7/2016 | Nikkel et al. ...... | H03H 9/02118 |
| 2004/0185594 A1* | 9/2004 | Nishihara ................ | H03H 3/02 438/53 |
| 2006/0006768 A1* | 1/2006 | Ishii ......................... | H03H 3/02 310/344 |
| 2006/0255883 A1* | 11/2006 | Ebuchi ..................... | H03H 3/02 333/191 |
| 2009/0153268 A1* | 6/2009 | Milsom ................ | H03H 9/0211 333/187 |
| 2010/0013573 A1 | 1/2010 | Umeda | |
| 2010/0141353 A1* | 6/2010 | Iwaki ................. | H03H 9/02118 333/133 |
| 2012/0182090 A1* | 7/2012 | Pang ................... | H03H 9/02086 333/187 |

(Continued)

*Primary Examiner* — Barbara Summons
(74) *Attorney, Agent, or Firm* — NSIP Law

(57) ABSTRACT

A bulk acoustic wave resonator may include: a piezoelectric layer including a piezoelectric material; a first electrode disposed on one surface of the piezoelectric layer; a second electrode disposed on the another surface of the piezoelectric layer; and a frame disposed on the one surface of the piezoelectric layer and surrounding the first electrode, wherein the frame is spaced apart from the first electrode by a predetermined gap.

7 Claims, 3 Drawing Sheets

(56) References Cited

U.S. PATENT DOCUMENTS

2014/0111288 A1* 4/2014 Nikkel ............... H03H 9/02118
                                                    333/187

* cited by examiner

BULK ACOUSTIC WAVE RESONATOR HAVING A FRAME SPACED APART FROM AN ELECTRODE

CROSS-REFERENCE TO RELATED APPLICATION(S)

This application claims the benefit of Korean Patent Application No. 10-2014-0173807 filed on Dec. 5, 2014, in the Korean Intellectual Property Office, the entire disclosure of which is incorporated herein by reference for all purposes.

BACKGROUND

1. Field

The following description relates to a bulk acoustic wave resonator.

2. Description of Related Art

In recent times, in order to efficiently use limited available frequency bandwidths, a band gap between used frequency bands has been decreased. In order to decrease interference between frequency bands caused by the deceased band gap, a bulk acoustic wave resonator having an increased quality factor (QF) has been widely used.

In addition, in order to increase data transmission amounts and data transfer rates, bulk acoustic wave resonators must have broad bandwidths. To this end, an electromechanical coupling coefficient (kt2) value of such bulk acoustic wave resonators must be increased.

In general, the QF and kt2 values of bulk acoustic wave resonators may have a conflicting relationship. Therefore, a technology capable of increasing the QF value or kt2 value of bulk acoustic wave resonators is desirable.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a bulk acoustic wave resonator may include: a piezoelectric layer including a piezoelectric material; a first electrode disposed on one surface of the piezoelectric layer; a second electrode disposed on another surface of the piezoelectric layer; and a frame disposed on the one surface of the piezoelectric layer and surrounding the first electrode, wherein the frame is spaced apart from the first electrode by a predetermined gap.

A non-conductive member may be disposed between the first electrode and the frame.

The non-conductive member may be in contact with the piezoelectric layer, the first electrode, and the frame, and a height of the non-conductive member may be greater than a height of the first electrode, in relation to the one surface of the piezoelectric layer.

The frame may be formed of a non-conductive material.

The frame may include an area which does not face the second electrode.

According to another general aspect, a bulk acoustic wave resonator may include: a piezoelectric layer comprising a piezoelectric material; a first electrode disposed on one surface of the piezoelectric layer; a second electrode disposed on another surface of the piezoelectric layer; and a frame disposed on the one surface of the piezoelectric layer and surrounding the first electrode, wherein the frame is formed of a non-conductive material.

The frame may include an area that does not face the second electrode.

The first electrode and the second electrode may have a circular shape, the frame may surround the first electrode in an annular shape, and a radius of the second electrode may be equal to or greater than a radius of the first electrode, and equal to or less than half of an inner diameter of the frame.

The frame may include an area that does not face the second electrode, may be spaced apart from the first electrode by a predetermined gap, and may be formed of a non-conductive material.

According to another general aspect, a bulk acoustic wave resonator may include: a piezoelectric layer comprising a piezoelectric material; a first electrode disposed on one surface of the piezoelectric layer; a second electrode disposed on another surface of the piezoelectric layer; and a non-conductive member disposed on the one surface of the piezoelectric layer and surrounding the first electrode, wherein a radius of the second electrode is greater than a radius of the first electrode.

The bulk acoustic wave resonator may include a frame disposed on the one surface of the piezoelectric layer and surrounding the non-conductive member.

A height of the non-conductive member may be greater than a height of the first electrode, in relation to the one surface of the piezoelectric layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIGS. 1 through 4 are cross-sectional views of example bulk acoustic wave resonators.

Figure 1:
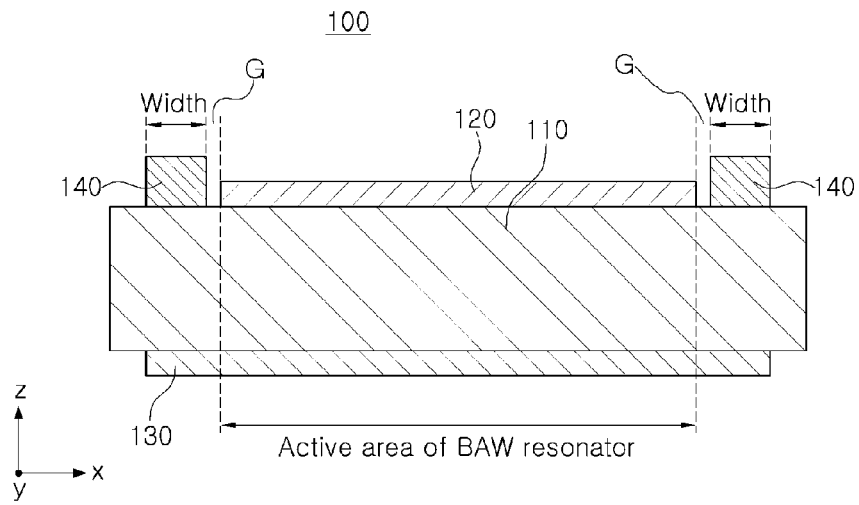
FIGS. 1 through 4 are cross-sectional views of example bulk acoustic wave resonators.

Referring to FIG. 1, a bulk acoustic wave resonator 100 according to an example includes a piezoelectric layer 110, a first electrode 120, a second electrode 130, and a frame 140.

The bulk acoustic wave resonator is operated by the first electrode 120 and the second electrode 130. The bulk acoustic wave resonator 100 may be operated as a filter while the piezoelectric layer 110 is vibrated when a high frequency potential is applied to the first electrode 120 and the second electrode 130. For example, the bulk acoustic wave resonator 100 may be suspended above a substrate through an air cavity in order to improve the reflection characteristics of acoustic waves.

In addition, because the bulk acoustic wave resonator 100 is a device for inducing waves or vibrations of a specific frequency using a resonance phenomenon, the bulk acoustic wave resonator 100 may be used as a component in a radio frequency (RF) device such as a filter or an oscillator. For example, the bulk acoustic wave resonator 100 may be used as a filter, a transmitter, a receiver, or a duplexer in a wireless communications device, and may also be used to wirelessly input and output data.

Hereinafter, the example structure of the bulk acoustic wave resonator 100 will be further described.

The piezoelectric layer 110 includes a piezoelectric material. The piezoelectric material is a material capable of converting dynamic energy into electrical energy. The piezoelectric layer 110 may extend in an x axis direction and a y axis direction.

The first electrode 120 is disposed on or over a first surface of the piezoelectric layer 110. For example, the first electrode 120 may be disposed on or over an upper surface of the piezoelectric layer 110 such that the first electrode 120 is positioned above the upper surface of the piezoelectric layer 110 in a z axis direction.

The second electrode 130 may be disposed on or over a second surface of the piezoelectric layer 110 that is opposite the first surface. For example, the second electrode 130 may be disposed on or over a lower surface of the piezoelectric layer 110 such that the second electrode 130 is positioned below the piezoelectric layer 110 in the z axis direction. A size of the second electrode 130 may be different from that of the first electrode 120. For example, the second electrode 130 may have a radius or length in the x axis direction and the y axis direction that is greater than a radius or length of the first electrode 120 in the x axis direction and the y axis direction.

In addition, the first electrode 120 and/or the second electrode 130 may contact the piezoelectric layer 110, or may be spaced apart from the piezoelectric layer 110. For example, an air layer, or the like, may be disposed between the first electrode 120 and the piezoelectric layer 110 and/or between the second electrode 130 and the piezoelectric layer 110.

The frame 140 is disposed on the first surface of the piezoelectric layer 110 and surrounds the first electrode 120. For example, the frame 140 is disposed above the piezoelectric layer 110 in the z axis direction and surrounds the first electrode 120 in the x axis direction and the y axis direction.

The frame 140 may confine acoustic energy in the interior of the resonator by reflecting lateral acoustic waves generated by the bulk acoustic wave resonator 100 to the interior of the bulk acoustic wave resonator 100. Thus, the quality factor (QF) of the bulk acoustic wave resonator 100 may be increased.

In addition, as a width of the frame 140 is increased, the frame 140 may more efficiently confine acoustic energy in the interior of the resonator 100. Thus, the QF of the bulk acoustic wave resonator 100 may be efficiently increased.

However, if the frame 140 is electrically connected with the first electrode 120, parasitic capacitance may be present between the frame 140 and the second electrode 130. The parasitic capacitance may reduce an electro-mechanical coupling coefficient (kt2) value of the bulk acoustic wave resonator 100. In addition, as the width of the frame 140 is increased, the occurrence of parasitic capacitance may be increased.

If the frame 140 is electrically connected with the first electrode 120, the bulk acoustic wave resonator 100 may increase the QF value by increasing the width of the frame 140 while the kt2 value reduced due to the increased parasitic capacitance with increasing width of the frame 140.

Referring to FIG. 1, the frame 140 may be spaced apart from the first electrode 120 by a predetermined gap G. Thus, an influence on the bulk acoustic wave resonator 100 due to the parasitic capacitance between the frame 140 and the second electrode 130 may be reduced.

Figure 2:
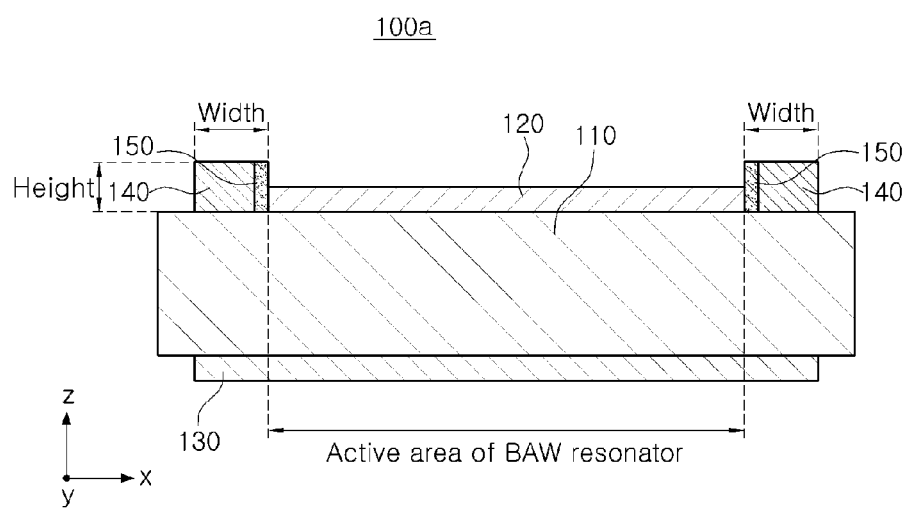

Referring to FIG. 2, a bulk acoustic wave resonator 100a according to an example includes the piezoelectric layer 110, the first electrode 120, the second electrode 130, the frame 140 and a non-conductive member 150 disposed between the frame 140 and the first electrode 120. By providing the non-conductive member 150 between the frame 140 and the first electrode 120 the influence on the bulk acoustic wave resonator 100 due to the parasitic capacitance between the frame 140 and the second electrode 130 may be reduced.

For example, the non-conductive member 150 may be in contact with the piezoelectric layer 110, the first electrode 120, and the frame 140. For example, a height of the non-conductive member 150 may be greater than that of the first electrode 120. Here, the height of the non-conductive member 150 and the height of the first electrode 120 are the lengths of these components in the z axis direction in relation to the upper surface of the piezoelectric layer 110.

Figure 3:
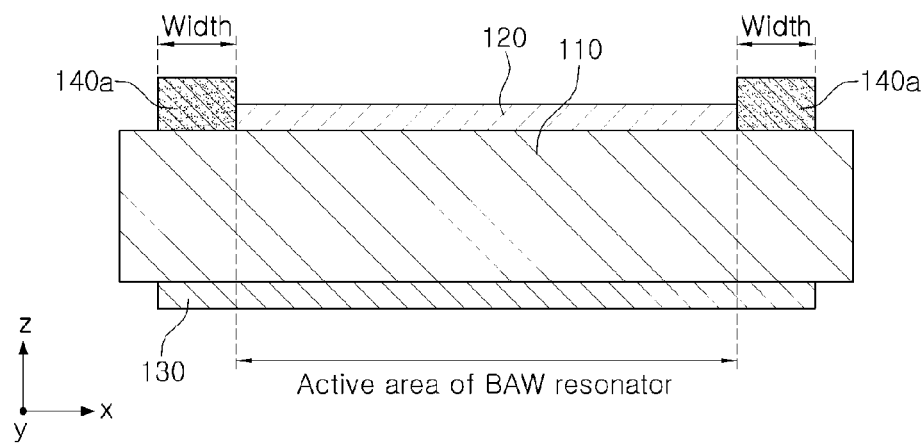

Referring to FIG. 3, a bulk acoustic wave resonator 100b according to another example includes the piezoelectric layer 110, the first electrode 120, the second electrode 130 and a frame 140a. The frame 140a is similar to the frame 140 shown in FIGS. 1 and 2, except that the frame 140a is formed of a non-conductive material. Thus, the parasitic capacitance between the frame 140 and the second electrode 130 may be further reduced.

Figure 4:
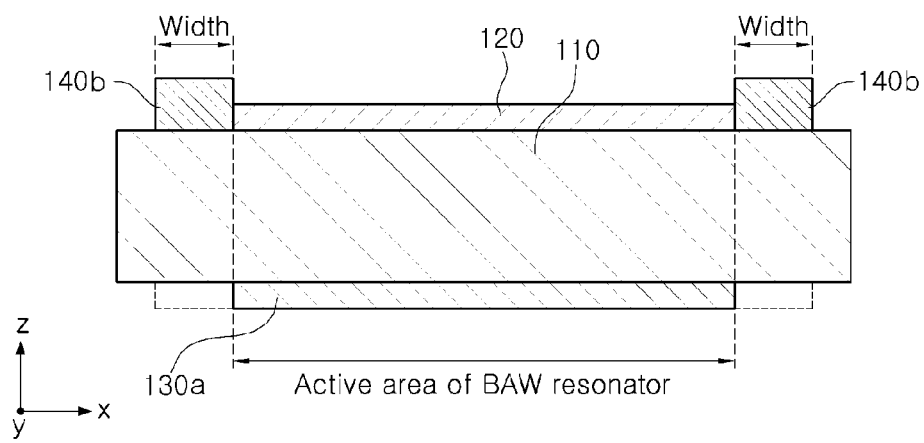

Referring to FIG. 4, a bulk acoustic wave resonator 100c according to an example includes the piezoelectric layer 110, the first electrode 120, a second electrode 130a and a frame 140b. The second electrode 130a is similar to the second electrode 130 in the previous examples, however the second electrode 130a is smaller than the second electrode 130 included in FIGS. 1-3. More specifically, the second electrode 130a has a radius or length in the x axis and y axis directions that is less than a radius or length of the first electrode 120 in the x axis and y axis directions. Accordingly, the frame 140b includes an area that does not face the second electrode 130a in the z axis direction. In other words, the frame 140b includes an area that is not positioned directly opposite the second electrode 130a in the z axis direction. Said yet another way, the second electrode 130a does not include an area that is positioned directly opposite the frame 140b in the z axis direction. The parasitic capacitance occurring in the area of the frame 140b that is not positioned directly opposite the second electrode 130a in the z axis direction may therefore be reduced. Thus, the parasitic capacitance between the frame 140b and the second electrode 130a may be reduced.

Figure 5:
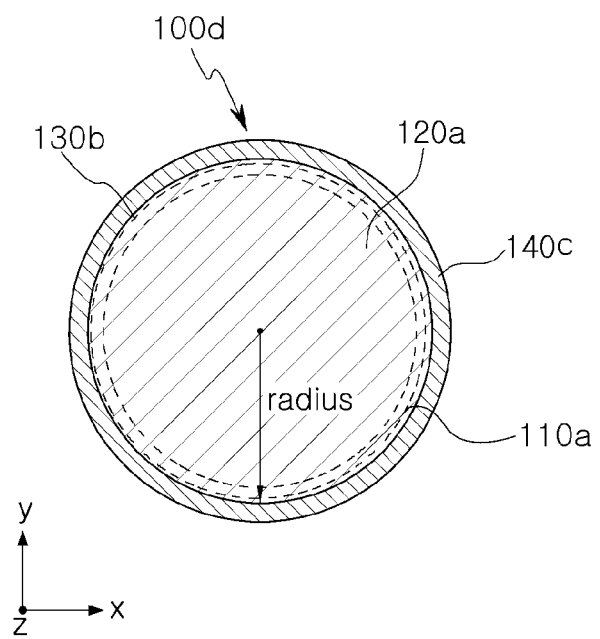
FIG. 5 is a plan view of a bulk acoustic wave resonator according to another example.

FIG. 5 is a plan view of the bulk acoustic wave resonator 100d, according to another example.

Referring to FIG. 5, the bulk acoustic wave resonator 100d includes a first electrode 120a having a circular shape. A frame 140c surrounds the first electrode 120a in an annular shape. A piezoelectric layer 110a and a second electrode 130b are provided below the first electrode 120 and the frame 140c. The piezoelectric layer 110 and the second electrode 130b have a circular shape. The bulk acoustic wave resonator 100d illustrated in FIG. 5 may have a structure similar to that of the bulk acoustic wave resonator 100b illustrated in FIG. 3.

In an alternative example, an annular empty space (e.g., gap G in FIG. 1) may be formed between the first electrode 120a and the frame 140c. That is, the bulk acoustic wave resonator 100d may be modified to have a structure similar to that of the bulk acoustic wave resonator 100 illustrated in FIG. 1.

In another alternative example, the non-conductive member 150 of FIG. 2 may be disposed between the first electrode 120a and the frame 140c in an annular configuration. That is, the bulk acoustic wave resonator 100d illustrated in FIG. 5 may be modified to have a structure similar to that of the bulk acoustic wave resonator 100a illustrated in FIG. 2.

In yet another alternative example, a radius of the second electrode 130b may be equal to or greater than a radius of the first electrode 120a and may be equal to or less than half of an inner diameter of the frame 140c. That is, the bulk acoustic wave resonator 100d illustrated in FIG. 5 may be modified to have a structure similar to that of the bulk acoustic wave resonator 100c illustrated in FIG. 4.

Figure 6:
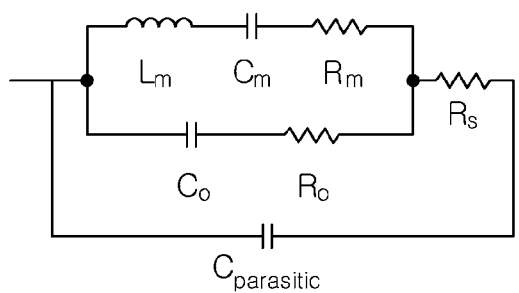
FIG. 6 is an example of a circuit diagram modeling the bulk acoustic wave resonator of FIG. 1.

FIG. 6 is a circuit diagram modeling a bulk acoustic wave resonator 100 according to an example.

Referring to FIG. 6, the bulk acoustic wave resonator is modeled as a circuit in which resistors Rm, Ro, and Rs, capacitors Cm and Co, and an inductor Lm are connected. The modeled bulk acoustic wave resonator includes parasitic capacitance C between the frame 140 and the second electrode 130.

As the width of the frame 140 increases, resistance of input impedance at an anti-resonance frequency may increase. Thus, the QF may increase. For example, in a case in which the width of the frame 140 is very narrow, the resistance of the input impedance at the anti-resonance frequency may be 1 kOhm to 2 kOhm. For example, in a case in which the width of the frame 140 is 3 μm, the resistance of the input impedance at the anti-resonance frequency may be 5 kOhm to 6 kOhm.

As the width of the frame 140 increases, the kt2 value may decrease. For example, in the case in which the width of the frame 140 is very narrow, the kt2 value may be about 7%. For example, in a case in which the width of the frame 140 is 3 μm, the kt2 value may be about 6%.

The bulk acoustic wave resonator 100 according to an example may reduce the parasitic capacitance between the second electrode 130 and the frame 140. Thus, the bulk acoustic wave resonator 100 may increase the kt2 value without decreasing a thickness of the frame 140. As a result, the kt2 value of the bulk acoustic wave resonator 100 may be increased without decreasing the QF and the QF thereof may be increased without decreasing the kt2 value. In addition, both the QF and the kt2 values of the bulk acoustic wave resonator 100 may be increased.

As set forth above, according to the examples described herein, the QF value or the kt2 value of a bulk acoustic wave resonator may be increased.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator comprising:
    a piezoelectric layer comprising a piezoelectric material;
    a first electrode disposed on one surface of the piezoelectric layer;
    a second electrode disposed on another surface of the piezoelectric layer;
    a frame disposed on the one surface of the piezoelectric layer and surrounding the first electrode; and
    a non-conductive member disposed between the first electrode and the frame,
    wherein the frame is spaced apart from the first electrode by a predetermined gap,
    wherein a height of the frame and a height of the non-conductive member are higher than a height of the first electrode in relation to the one surface of the piezoelectric layer, and
    wherein the second electrode has a length shorter than a length of the first electrode.

2. The bulk acoustic wave resonator of claim 1, wherein: the non-conductive member is in contact with the piezoelectric layer, the first electrode, and the frame.

3. The bulk acoustic wave resonator of claim 1, wherein the frame is formed of a non-conductive material.

4. The bulk acoustic wave resonator of claim 1, wherein the frame includes an area that does not face the second electrode.

5. The bulk acoustic wave resonator of claim 1, wherein the bulk acoustic resonator is suspended above a substrate and an air cavity.

6. The bulk acoustic wave resonator of claim 5, wherein the frame and non-conductive member are disposed on a top surface of the piezoelectric layer and a bottom surface of the piezoelectric layer is in contact with the air cavity.

7. A bulk acoustic wave resonator comprising:
    a piezoelectric layer comprising a piezoelectric material;
    a first electrode disposed on one surface of the piezoelectric layer;
    a second electrode disposed on another surface of the piezoelectric layer;
    a frame disposed on the one surface of the piezoelectric layer and surrounding the first electrode;
    a non-conductive member disposed between the first electrode and the frame, wherein the frame is non-conducting and is spaced apart from the first electrode by a predetermined gap, and
wherein the second electrode has a length shorter than a length of the first electrode.

* * * * *